United States Patent
Ferguson et al.

(10) Patent No.: US 8,572,533 B2
(45) Date of Patent: Oct. 29, 2013

(54) WAIVING DENSITY VIOLATIONS

(75) Inventors: John G. Ferguson, Tualatin, OR (US); Bikram Garg, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/304,099

(22) Filed: Nov. 23, 2011

(65) Prior Publication Data

US 2013/0132918 A1 May 23, 2013

(51) Int. Cl.
*G06F 17/50* (2006.01)

(52) U.S. Cl.
USPC ............................ 716/112; 716/110; 716/111

(58) Field of Classification Search
USPC ........................................ 716/110, 111, 112
See application file for complete search history.

(56) References Cited

U.S. PATENT DOCUMENTS

| | | | |
|---|---|---|---|
| 7,051,311 B2* | 5/2006 | Tomita et al. | 716/127 |
| 7,381,646 B2* | 6/2008 | Su et al. | 438/687 |
| 7,565,638 B2* | 7/2009 | Hoerold | 716/106 |
| 7,617,463 B2* | 11/2009 | Anazawa | 716/136 |
| 7,653,892 B1* | 1/2010 | Gennari et al. | 716/50 |
| 7,725,861 B2* | 5/2010 | Cheng et al. | 716/126 |
| 7,805,692 B2* | 9/2010 | Jeng | 716/122 |
| 7,954,072 B2* | 5/2011 | Liu et al. | 716/54 |
| 8,122,418 B2* | 2/2012 | Uchida | 716/122 |
| 2007/0192754 A1* | 8/2007 | Hofsaess | 716/5 |
| 2010/0257496 A1* | 10/2010 | Ferguson et al. | 716/5 |

* cited by examiner

*Primary Examiner* — Sun Lin
(74) *Attorney, Agent, or Firm* — Klarquist Sparkman, LLP

(57) ABSTRACT

Waiver regions may be identified by waiver identification items. The waiver identification items may be determined based on conducting a density check process. Additionally or alternatively, reference patterns for pattern matching, cell names or markers may serve as the waiver identification items. Waiver geometric items may be created for the waiver regions and added to the layout design. Based on an overlap of a density check window with the waiver geometric items and waiving threshold information, a density violation in that density check window is determined to be reported as a density violation or a waived density violation with some implementations of the invention. With some other implementations of the invention, pattern density of a density check window may not be checked if an overlap of the density check window with the waiver geometric items is above a waiving threshold value.

19 Claims, 5 Drawing Sheets

WAIVING DENSITY VIOLATIONS

FIELD OF THE INVENTION

The present invention is directed to the physical verification of integrated circuit designs. Various aspects of the invention may be particularly suitable for waiving false density violations reported during a physical verification electronic design automation process.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow are highly dependent upon the type of microcircuit, its complexity, the design team, and the microcircuit fabricator or foundry that will manufacture the microcircuit. Software and hardware "tools" then verify the design at various stages of the design flow by running software simulators and/or hardware emulators, and errors in the design are corrected.

Several steps are common to all design flows. First, the specifications for the new microcircuit are described in terms of logical operations, typically using a hardware design language (HDL), such as VHDL. After the accuracy of the logical design is confirmed, the logical design is converted into device design data by synthesis software. The device design data, in the form of a schematic, represents the specific electronic devices, such as transistors, resistors, and capacitors, which will achieve the desired logical result and their interconnections. Preliminary timing estimates for portions of the circuit may also be made at this stage, using an assumed characteristic speed for each device. This schematic generally corresponds to the level of representation displayed in conventional circuit diagrams.

Once the relationships between circuit devices have been established, the design is again transformed into physical design data describing specific geometric elements. These geometric elements, often referred to as a "layout" design, define the shapes that will be created in various materials to form the specified circuit devices. Custom layout editors, such as Mentor Graphics' IC Station or Cadence's Virtuoso are commonly used for this task. Automated place and route tools also will frequently be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, the shapes in the layer representation of an implant layer will define the regions where doping will occur, while the shapes in the layer representation of a metal layer will define the locations of the metal wires used to connect the circuit devices. Thus, the layout design data represents the patterns that will be written onto masks to fabricate the desired microcircuit using, for example, photolithographic processes.

Modern integrated circuits typically will be formed of multiple layers of material, such as metal, diffusion material, and polysilicon. During the manufacturing process, layers of material are formed on top of one another sequentially. After each layer is created, portions of the layer are removed to form polygon structures. Together, the polygon structures of material form the functional circuit devices, such as transistors, capacitors and resistors, which will make up the integrated circuit. Before a new layer is formed over the structures in an existing layer, however, the existing layer must be polished to ensure planarity. Polishing using any of various types of polishing processes sometimes will generically be referred to as "planarization."

One problem with conventional planarization methods is that different materials will have different densities, so softer materials will be polished more than harder materials. As a result, a layer's surface may become uneven, causing the next layer to be more uneven. In some situations, the uppermost layers of material may have a very irregular surface topography. Such irregular surface topographies may cause a variety of flaws in the circuit structures, such as holes, loss of contact, and other manufacturing defects.

To improve the planarity of a layer of material, the integrated circuit designer (or manufacturer) often will analyze a circuit layout design for empty regions in the layer. That is, the designer or manufacturer will review the pattern density of the polygons that will be formed in the layer, to identify regions that are empty of these polygon structures or of which the density of these polygon structures is too low. These regions are sometimes referred to as density violations and this process as the density check process. After the density check process, the designer or manufacturer will modify the circuit layout design to fill the identified regions with data representing "dummy" or "fill" polygon structures. That is, the designer or manufacturer will increase the density of patterns in the circuit layout design for the layer. When the circuit is manufactured, these "fill" polygon structures will be formed alongside the "functional" polygon structures (i.e., the polygon structures used to form functional circuit devices), so that the overall surface of the layer is relatively flat. This type of corrective technique will often be implemented using a software application for identifying and manipulating structures defined in a circuit layout design, such as the CALIBRE® verification and manufacturability software tools available from Mentor Graphics® Corporation of Wilsonville, Oreg.

During the density check process, a designer or a manufacturer may choose to "waive" some density violations due to various concerns. For example, adding fill polygons may increase the capacitance of the layer. If fill polygons are placed too close to functional polygons, the increased capacitance may cause the surrounding circuit devices to exceed their minimum timing requirements. How to waive density violations efficiently or automatically, however, remains a challenge.

BRIEF SUMMARY OF THE INVENTION

Waiver regions are layout areas in a layout design where density violations may be waived. Waiver regions may be identified by waiver identification items. The waiver identification items may be determined based on conducting a density check process. Additionally or alternatively, reference patterns for pattern matching, cell names or markers may serve as the waiver identification items. Waiver geometric items may be created for the waiver regions and added to the layout design. The waiver geometric elements and the waiver region identification items may different entities in some embodiments of the invention. In some other embodiments of the invention, the waiver region identification items may comprise the waiver geometric elements. In still some other embodiments of the invention, the waiver geometric elements may comprise the waiver region identification items.

Based on an overlap of a density check window with the waiver geometric items and waiving threshold information, a density violation in that density check window is determined to be reported as a density violation or a waived density violation with some implementations of the invention. With some other implementations of the invention, pattern density of a density check window may not be checked if an overlap of the density check window with the waiver geometric items is above a waiving threshold value. Waiving data that associate the waiver identification items with the waiver geometric items and the waiving threshold information may be stored in a single file or a derived design layer for all density check windows.

DETAILED DESCRIPTION OF THE INVENTION

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
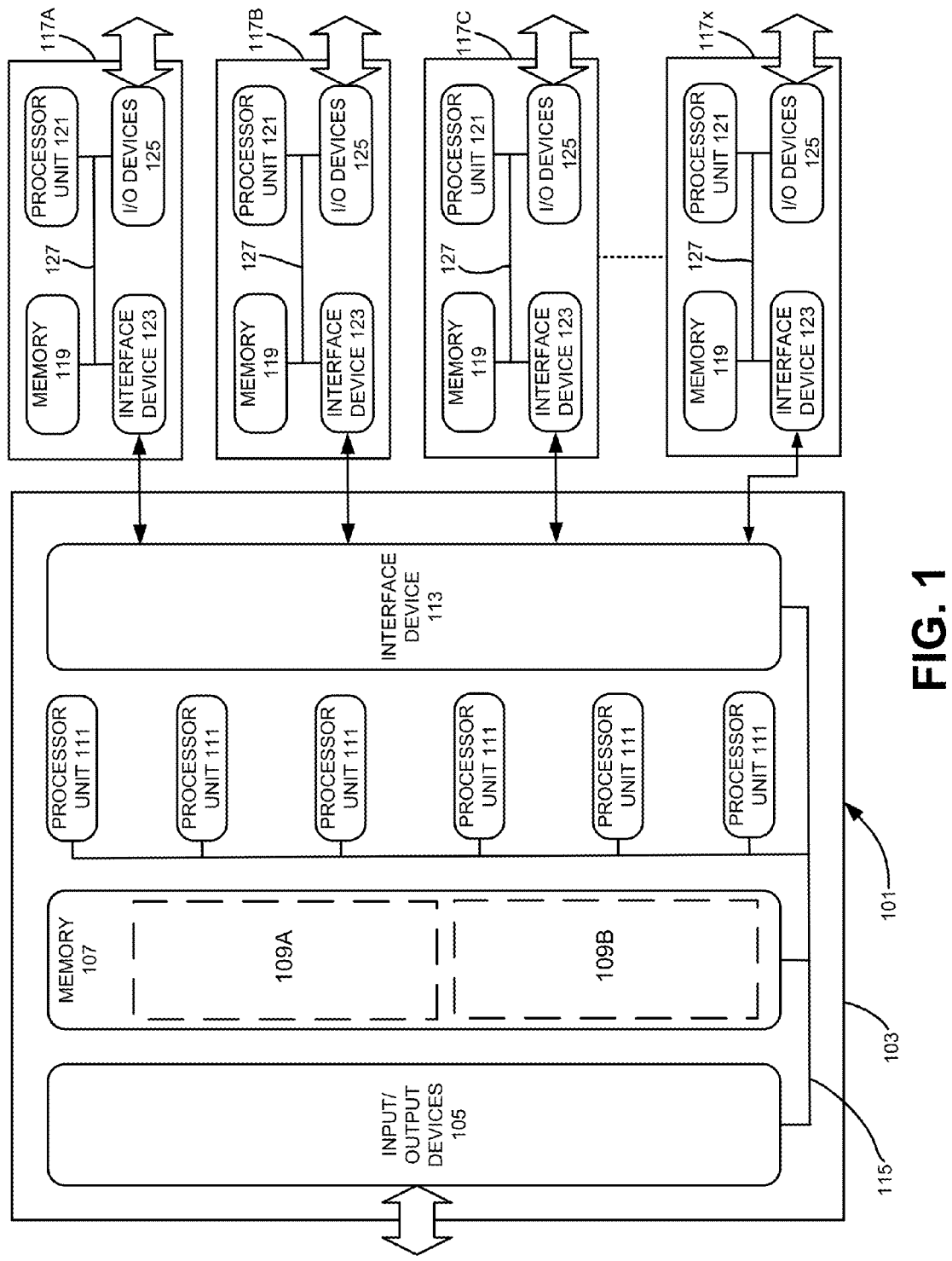
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
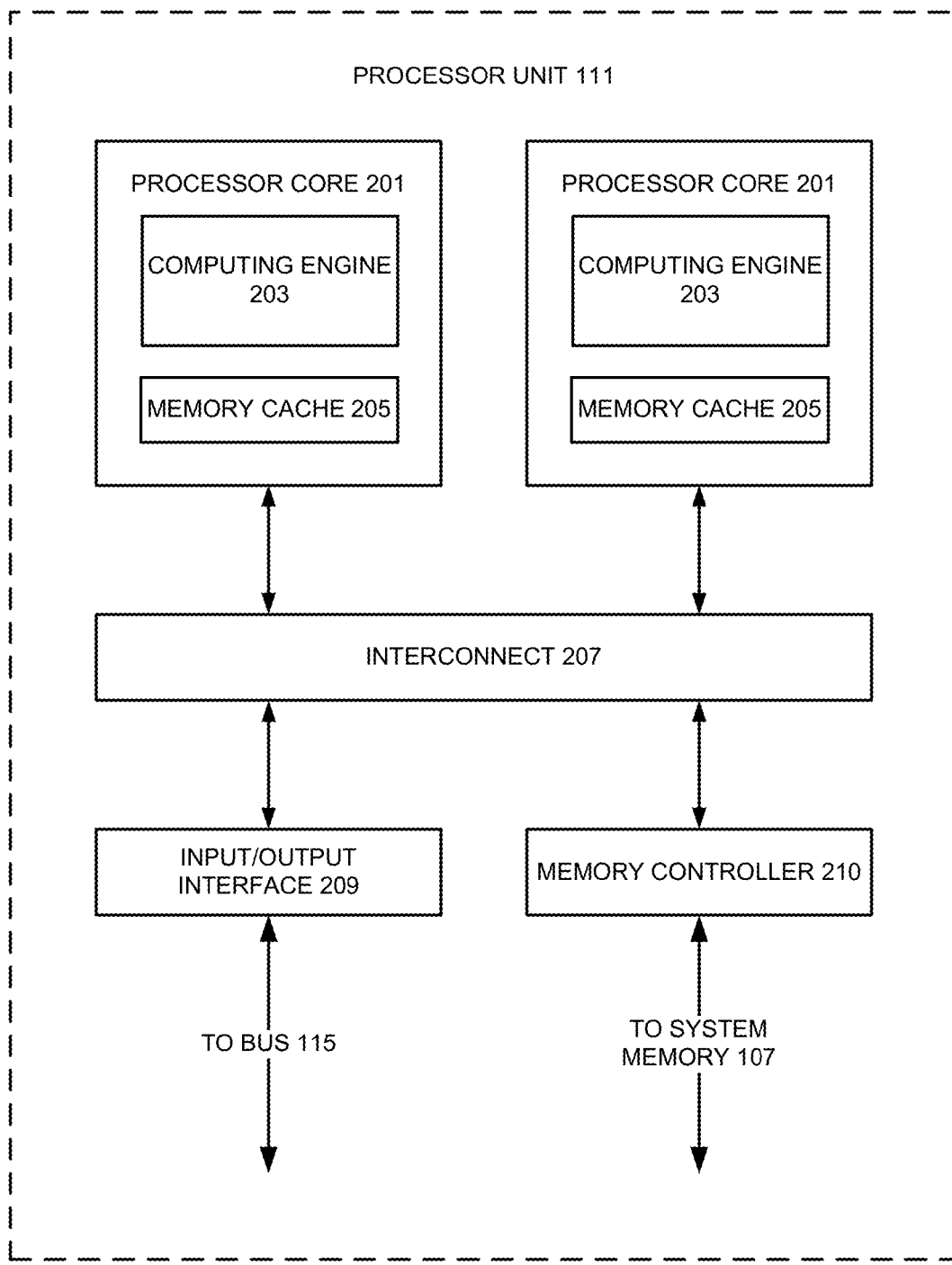
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Electronic Design Automation

As previously noted, various embodiments of the invention are related to electronic design automation. In particular, various implementations of the invention may be used to improve the operation of electronic design automation software tools that identify, verify and/or modify design data for manufacturing a microdevice, such as a microcircuit. As used herein, the terms "design" and "design data" are intended to encompass data describing an entire microdevice, such as an integrated circuit device or micro-electromechanical system (MEMS) device. This term also is intended to encompass a smaller set of data describing one or more components of an entire microdevice, however, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. It should be noted that, unless otherwise specified, the term "design" as used herein is intended to encompass any type of design, including both a physical layout design and a logical design.

Designing and fabricating microcircuit devices involve many steps during a 'design flow' process. These steps are highly dependent on the type of microcircuit, its complexity, the design team, and the fabricator or foundry that will manufacture the microcircuit from the design. Several steps are common to most design flows, however. First, a design specification is modeled logically, typically in a hardware design language (HDL). Once a logical design has been created, various logical analysis processes are performed on the design to verify its correctness. More particularly, software and hardware "tools" verify that the logical design will provide the desired functionality at various stages of the design flow by running software simulators and/or hardware emulators, and errors are corrected. For example, a designer may employ one or more functional logic verification processes to verify that, given a specified input, the devices in a logical design will perform in the desired manner and provide the appropriate output.

In addition to verifying that the devices in a logic design will provide the desired functionality, some designers may employ a design logic verification process to verify that the logical design meets specified design requirements. For example, a designer may create rules such as, e.g., every transistor gate in the design must have an electrical path to ground that passes through no more than three other devices, or every transistor that connects to a specified power supply also must be connected to a corresponding ground node, and not to any other ground node. A design logic verification process then will determine if a logical design complies with specified rules, and identify occurrences where it does not.

After the logical design is deemed satisfactory, it is converted into physical design data by synthesis software. This physical design data or "layout" design data may represent, for example, the geometric elements that will be written onto a mask used to fabricate the desired microcircuit device in a photolithographic process at a foundry. For conventional mask or reticle writing tools, the geometric elements typically will be polygons of various shapes. Thus, the layout design data usually includes polygon data describing the features of polygons in the design. It is very important that the physical design information accurately embody the design specification and logical design for proper operation of the device. Accordingly, after it has been created during a synthesis process, the physical design data is compared with the original logical design schematic in a process sometimes referred to as a "layout-versus-schematic" (LVS) process.

Once the correctness of the logical design has been verified, and geometric data corresponding to the logical design has been created in a layout design, the geometric data then may be analyzed. For example, because the physical design data is employed to create masks used at a foundry, the data must conform to the foundry's requirements. Each foundry specifies its own physical design parameters for compliance with their processes, equipment, and techniques. Accordingly, the design flow may include a process to confirm that the design data complies with the specified parameters. During this process, the physical layout of the circuit design is compared with design rules in a process commonly referred to as a "design rule check" (DRC) process. In addition to rules specified by the foundry, the design rule check process may also check the physical layout of the circuit design against other design rules, such as those obtained from test chips, general knowledge in the industry, previous manufacturing experience, etc.

With modern electronic design automation design flows, a designer may additionally employ one or more "design-for-manufacture" (DFM) software tools. As previously noted, design rule check processes attempt to identify, e.g., elements representing structures that will almost certainly be improperly formed during a manufacturing process. "Design-For-Manufacture" tools, however, provide processes that attempt to identify elements in a design representing structures with a significant likelihood of being improperly formed during the manufacturing process. A "design-for-manufacture" process may additionally determine what impact the improper formation of the identified elements will have on the yield of devices manufactured from the circuit design, and/or modifications that will reduce the likelihood that the identified elements will be improperly formed during the manufacturing process. For example, a "design-for-manufacture" (DFM) software tool may identify wires that are connected by only a single via, determine the yield impact for manufacturing a circuit from the design based upon the probability that each individual single via will be improperly formed during the manufacturing process, and then identify areas where redundant vias can be formed to supplement the single vias.

It should be noted that, in addition to "design-for-manufacture," various alternate terms are used in the electronic design automation industry. Accordingly, as used herein, the term "design-for-manufacture" or "design-for-manufacturing" is intended to encompass any electronic design automation process that identifies elements in a design representing structures that may be improperly formed during the manufacturing process. Thus, "design-for-manufacture" (DFM) software tools will include, for example, "lithographic friendly design" (LFD) tools that assist designers to make trade-off decisions on how to create a circuit design that is more robust and less sensitive to lithographic process windows. They will also include "design-for-yield" (DFY) electronic design automation tools, "yield assistance" electronic design automation tools, and "chip cleaning" and "design cleaning" electronic design automation tools.

After a designer has used one or more geometry analysis processes to verify that the physical layout of the circuit design is satisfactory, the designer may then perform one or more simulation processes to simulate the operation of a manufacturing process, in order to determine how the design will actually be realized by that particular manufacturing process. A simulation analysis process may additionally modify the design to address any problems identified by the simulation. For example, some design flows may employ one or more processes to simulate the image formed by the physical layout of the circuit design during a photolithographic process, and then modify the layout design to improve the resolution of the image that it will produce during a photolithography process.

These resolution enhancement techniques (RET) may include, for example, modifying the physical layout using optical proximity correction (OPC) or by the addition of sub-resolution assist features (SRAF). Other simulation analysis processes may include, for example, phase shift mask (PSM) simulation analysis processes, etch simulation analysis processes and planarization simulation analysis processes. Etch simulation analysis processes simulate the removal of materials during a chemical etching process, while planarization simulation processes simulate the polishing of the circuit's surface during a chemical-mechanical etching process. These simulation analysis processes may identify, for example, regions where an etch or polishing process will not leave a sufficiently planar surface. These simulation analysis processes may then modify the physical layout design to, e.g., include more geometric elements in those regions to increase their density.

Once a physical layout design has been finalized, the geometric elements in the design are formatted for use by a mask or reticle writing tool. Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool. Accordingly, the larger geometric elements in a physical layout design data will typically be "fractured" into the smaller, more basic polygons that can be written by the mask or reticle writing tool.

It should be appreciated that various design flows may repeat one or more processes in any desired order. Thus, with some design flows, geometric analysis processes can be interleaved with simulation analysis processes and/or logical analysis processes. For example, once the physical layout of the circuit design has been modified using resolution enhancement techniques, then a design rule check process or design-for-manufacturing process may be performed on the modified layout. Further, these processes may be alternately repeated until a desired degree of resolution for the design is obtained. Similarly, a design rule check process and/or a design-for-manufacturing process may be employed after an optical proximity correction process, a phase shift mask simulation analysis process, an etch simulation analysis process or a planarization simulation analysis process. Examples of electronic design tools that employ one or more of the logical analysis processes, geometry analysis processes or simulation analysis processes discussed above are described in U.S. Pat. No. 6,230,299 to McSherry et al., issued May 8, 2001, U.S. Pat. No. 6,249,903 to McSherry et al., issued Jun. 19, 2001, U.S. Pat. No. 6,339,836 to Eisenhofer et al., issued Jan. 15, 2002, U.S. Pat. No. 6,397,372 to Bozkus et al., issued May 28, 2002, U.S. Pat. No. 6,415,421 to Anderson et al., issued Jul. 2, 2002, and U.S. Pat. No. 6,425,113 to Anderson et al., issued Jul. 23, 2002, each of which are incorporated entirely herein by reference.

Software Tools for Simulation, Verification or Modification of a Circuit Layout

To facilitate an understanding of various embodiments of the invention, one such software tool for automatic design automation, directed to the analysis and modification of a design for an integrated circuit, will now be generally described. As previously noted, the terms "design" and "design data" are used herein to encompass data describing an entire microdevice, such as an integrated circuit device or micro-electromechanical system (MEMS) device. These terms also are intended, however, to encompass a smaller set of data describing one or more components of an entire microdevice, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. As also previously noted, unless otherwise specified, the term "design" as used herein is intended to encompass any type of design, including both physical layout designs and logical designs.

Figure 3:
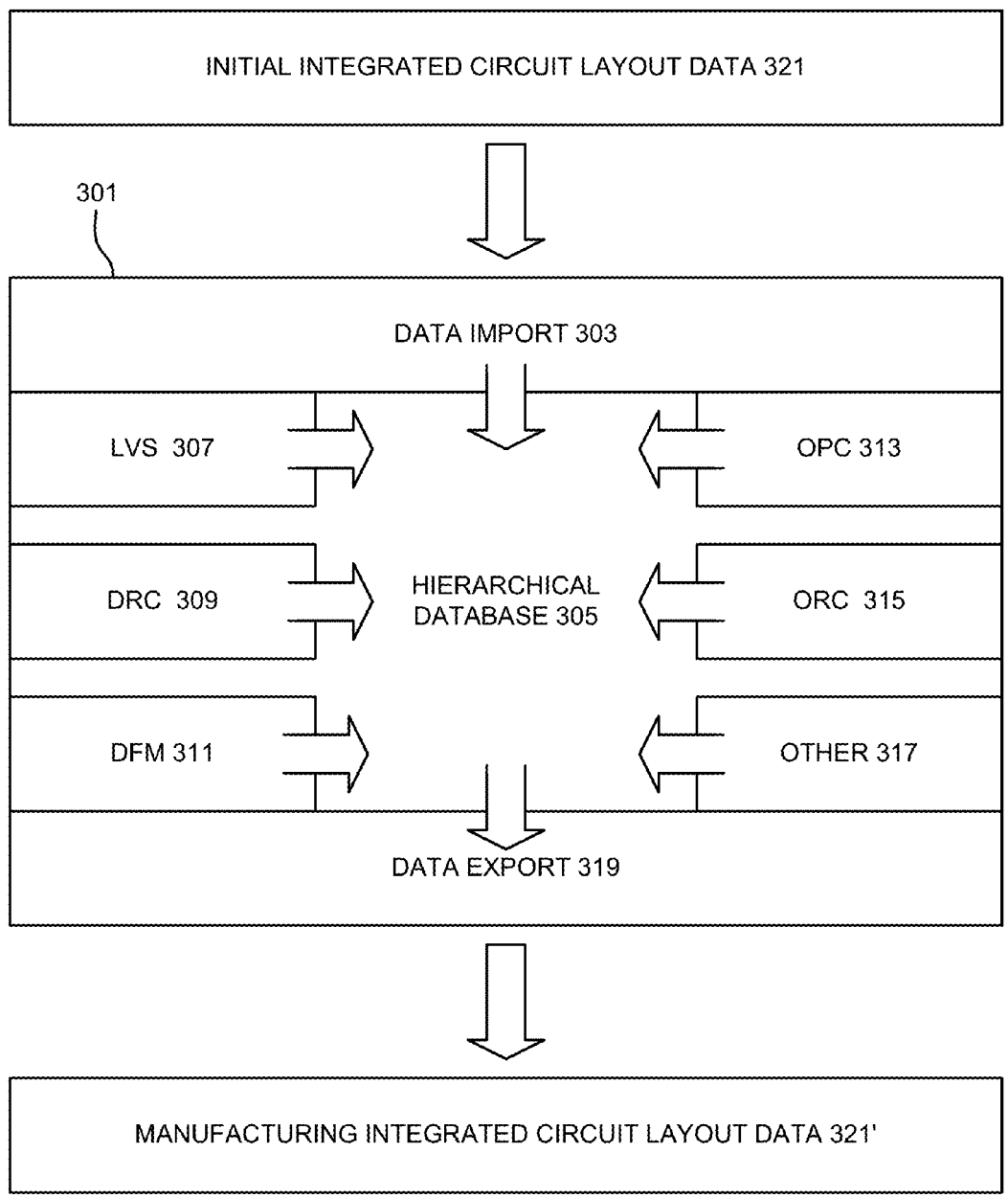
FIG. 3 schematically illustrates an example of a family of software tools for physical verification that may employ error waiver techniques according to various embodiments of the invention.

As seen in FIG. 3, an analysis tool 301, which may be implemented by a variety of different software applications, includes a data import module 303 and a hierarchical database 305. The analysis tool 301 also includes a layout-versus-schematic (LVS) verification module 307, a design rule check (DRC) module 309, a design-for-manufacturing (DFM) module 311, an optical proximity correction (OPC) module 313, and an optical proximity rule check (ORC) module 315. The analysis tool 301 may further include other modules 317 for performing additional functions as desired, such as a phase shift mask (PSM) module (not shown), an etch simulation analysis module (not shown) and/or a planarization simulation analysis module (not shown). The tool 301 also has a data export module 319. One example of such an analysis tool is the Calibre family of software applications available from Mentor Graphics Corporation of Wilsonville, Oreg.

Initially, the tool 301 receives data 321 describing a physical layout design for an integrated circuit. The layout design data 321 may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics, Inc. The layout data 321 includes geometric elements for manufacturing one or more portions of an integrated circuit device. For example, the initial integrated circuit layout data 321 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnection line to the contact electrode. The initial integrated circuit layout data 321 may be converted by the data import module 303 into a format that can be more efficiently processed by the remaining components of the tool 301.

Once the data import module 303 has converted the original integrated circuit layout data 321 to the appropriate format, the layout data 321 is stored in the hierarchical database 305 for use by the various operations executed by the modules 305-317. Next, the layout-versus-schematic module 307 checks the layout design data 321 in a layout-versus-schematic process, to verify that it matches the original design specifications for the desired integrated circuit. If discrepancies between the layout design data 321 and the logical design for the integrated circuit are identified, then the layout design data 321 may be revised to address one or more of these discrepancies. Thus, the layout-versus-schematic process performed by the layout-versus-schematic module 307 may lead to a new version of the layout design data with revisions. According to various implementations of the invention tool 301, the layout data 321 may be manually revised by a user, automatically revised by the layout-versus-schematic module 307, or some combination thereof Next, the design rule check module 309 confirms that the verified layout data 321 complies with defined geometric design rules. If portions of the layout data 321 do not adhere to or otherwise violate the design rules, then the layout data 321 may be modified to ensure that one or more of these portions complies with the design rules. The design rule check process performed by the design rule check module 309 thus also may lead to a new version of the layout design data with various revisions. Again, with various implementations of the invention tool 301, the layout data 321 may be manually modified by a user, automatically modified by the design rule check module 309, or some combination thereof The modified layout data 321 is then processed by the design for manufacturing module 311. As previously noted, a "design-for-manufacture" processes attempts to identify elements in a design representing structures with a significant likelihood of being improperly formed during the manufacturing process. A "design-for-manufacture" process may additionally determine what impact the improper formation of the identified structures will have on the yield of devices manufactured from the circuit design, and/or modifications that will reduce the likelihood that the identified structures may be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

The processed layout data 321 is then passed to the optical proximity correction module 313, which corrects the layout data 321 for manufacturing distortions that would otherwise occur during the lithographic patterning. For example, the optical proximity correction module 313 may correct for image distortions, optical proximity effects, photoresist kinetic effects, and etch loading distortions. The layout data 321 modified by the optical proximity correction module 313 then is provided to the optical process rule check module 315

The optical process rule check module 315 (more commonly called the optical rules check module or ORC module) ensures that the changes made by the optical proximity correction module 313 are actually manufacturable, a "downstream-looking" step for layout verification. This compliments the "upstream-looking" step of the LVS performed by the LVS module 307 and the self-consistency check of the DRC process performed by the DRC module 309, adding symmetry to the verification step. Thus, each of the processes performed by the design for manufacturing process 311, the optical proximity correction module 313, and the optical process rule check module 315 may lead to a new version of the layout design data with various revisions.

As previously noted, other modules 317 may be employed to perform alternate or additional manipulations of the layout data 321, as desired. For example, some implementations of the tool 301 may employ, for example, a phase shift mask module. As previously discussed, with a phase-shift mask (PSM) analysis (another approach to resolution enhancement technology (RET)), the geometric elements in a layout design are modified so that the pattern they create on the reticle will introduce contrast-enhancing interference fringes in the image. The tool 301 also may alternately or additionally employ, for example, an etch simulation analysis processes or a planarization simulation analysis processes. The process or processes performed by each of these additional modules 317 may also lead to the creation of a new version of the layout data 321 that includes revisions.

After all of the desired operations have been performed on the initial layout data 321, the data export module 319 converts the processed layout data 321 into manufacturing integrated circuit layout data 323 that can be used to form one or more masks or reticules to manufacture the integrated circuit (that is, the data export module 319 converts the processed layout data 321 into a format that can be used in a photolithographic manufacturing process). Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool.

Accordingly, the data export module 319 may "fracture" larger geometric elements in the layout design, or geometric elements that are not right triangles, rectangles or trapezoids (which typically are a majority of the geometric elements in a layout design) into the smaller, more basic polygons that can be written by the mask or reticle writing tool. Of course, the data export module 319 may alternately or additionally convert the processed layout data 321 into any desired type of data, such as data for use in a synthesis process (e.g., for creating an entry for a circuit library), data for use in a place-and-route process, data for use in calculating parasitic effects, etc. Further, the tool 301 may store one or more versions of the layout 321 containing different modifications, so that a designer can undo undesirable modifications. For example, the hierarchical database 305 may store alternate versions of the layout data 321 created during any step of the process flow between the modules 307-317.

Data Organization

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells.

By categorizing microcircuit design data into hierarchical cells, large data structures can be processed more quickly and efficiently. For example, a circuit designer typically will analyze a design to ensure that each circuit feature described in the design complies with specified design rules. With the above example, instead of having to analyze each feature in the entire 128 kB memory array, a design rule check process can analyze the features in a single bit cell. If the cells are identical, then the results of the check will then be applicable to all of the single bit cells. Once it has confirmed that one instance of the single bit cells complies with the design rules, the design rule check process then can complete the analysis of a register cell simply by analyzing the features of its additional miscellaneous circuitry (which may itself be made of up one or more hierarchical cells). The results of this check will then be applicable to all of the register cells. Once it has confirmed that one instance of the register cells complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

With various examples of the invention, layout design data may include two different types of data: "drawn layer" design data and "derived layer" design data. The drawn layer data describes geometric elements that will be used to form structures in layers of material to produce the integrated circuit. The drawn layer data will usually include polygons that will be used to form structures in metal layers, diffusion layers, and polysilicon layers. The derived layers will then include features made up of combinations of drawn layer data and other derived layer data. Thus, with a transistor gate, derived layer design data describing the gate may be derived from the intersection of a polygon in the polysilicon material layer and a polygon in the diffusion material layer.

For example, a design rule check process performed by the design rule check module 309 typically will perform two types of operations: "check" operations that confirm whether design data values comply with specified parameters, and "derivation" operations that create derived layer data. A transistor gate design data thus may be created by the following derivation operation:

gate=diff AND poly

The results of this operation will be a "layer" of data identifying all intersections of diffusion layer polygons with polysilicon layer polygons. Likewise, a p-type transistor gate, formed by doping the diffusion layer with n-type material, is identified by the following derivation operation:

pgate=nwell AND gate

The results of this operation then will be another "layer" of data identifying all transistor gates (i.e., intersections of diffusion layer polygons with polysilicon layer polygons) where the polygons in the diffusion layer have been doped with n-type material.

A check operation performed by the design rule check module 309 will then define a parameter or a parameter range for a data design value. For example, a user may want to ensure that no metal wiring line is within a micron of another wiring line. This type of analysis may be performed by the following check operation:

external metal<1

The results of this operation will identify each polygon in the metal layer design data that are closer than one micron to another polygon in the metal layer design data.

Also, while the above operation employs drawn layer data, check operations may be performed on derived layer data as well. For example, if a user wanted to confirm that no transistor gate is located within one micron of another gate, the design rule check process might include the following check operation:

external gate<1

The results of this operation will identify all gate design data representing gates that are positioned less than one micron from another gate. It should be appreciated, however, that this check operation cannot be performed until a derivation operation identifying the gates from the drawn layer design data has been performed.

Tools and Methods for Waiving Density Violations

Figure 4:
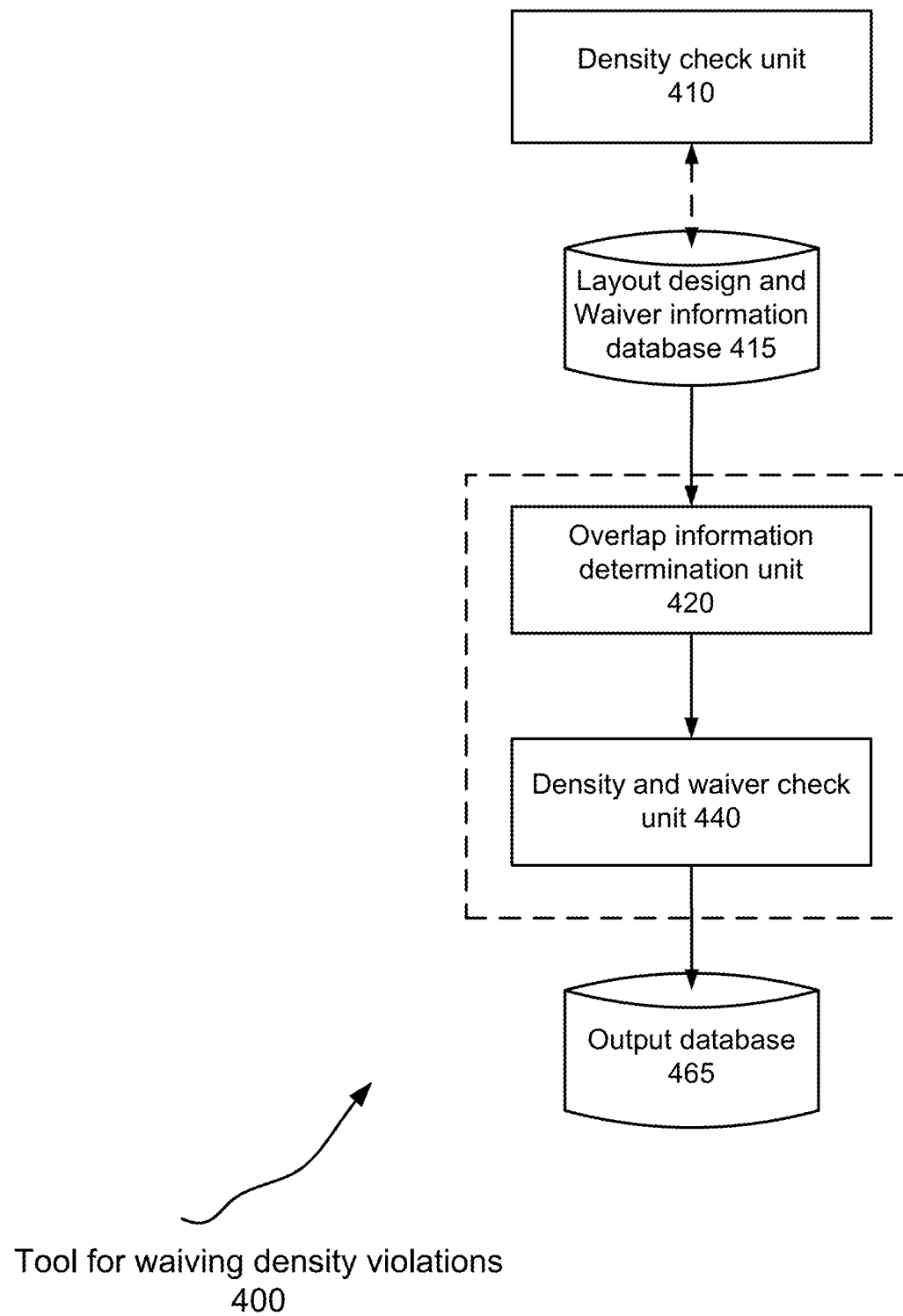
FIG. 4 illustrates an example of a tool for waiving density violations according to various embodiments of the invention.

FIG. 4 illustrates an example of a tool for waiving density violations according to various embodiments of the invention. As seen in the figure, the tool for waiving density violations 400 includes two units: an overlap information determination unit 420 and a density and waiver check unit 440. As will be discussed in more detail below, some implementations of the tool for waiving density violations 400 may cooperate with (or incorporate) one or more of a layout design and waiver information database 415, an output database 465, and a density check unit 410. While the layout design and waiver information database 415 and the output database 465 are shown as separate units in FIG. 4, a single data storage medium may be used to implement both of these databases.

According to some embodiments of the invention, one or more of the overlap information determination unit 420, the density and waiver check unit 440, and the preliminary density check unit 410 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the overlap information determination unit 420, the density and waiver check unit 440, and the preliminary density check unit 410. As used herein, the term "non-transitory computer-readable medium" refers to computer-readable medium that are capable of storing data for future retrieval, and not just propagating electro-magnetic waves. The non-transitory computer-readable medium may be, for example, a magnetic storage device, an optical storage device, a "punched" surface type device, or a solid state storage device.

For ease of understanding, waiving density violation methods that may be employed according to various embodiments of the invention will be described with reference to the tool for waiving density violations 400, illustrated in FIG. 4. It should be appreciated, however, that alternate implementations of a tool for waiving density violations 400 may be used to perform waiving density violation methods according to various embodiments of the invention.

Various waiving density violation methods may start with the tool for waiving density violations 400 receiving layout design data for a layout design and density violation waiver information. The density violation waiver information may comprise waiver data that associate waiver region identification items with waiver geometric elements and with waiving threshold information. The waiver region identification items are used to identify waiver regions. The waiver regions are layout design areas in which density violations may be designated as false errors. The waiver geometric elements are generated for masking the waiver regions and/or for determining whether to waive density violations associated with the density check windows. The waiving determination is based on overlaps of the waiver geometric elements with density check windows and the waiving threshold information. The details of the comparison will be discussed below.

The waiving data that associate waiver region identification items with waiver geometric elements and with waiving threshold information can be stored in a single data structure such as a data file or a derived design layer for all the waiver regions. The layout design and waiver information database 415 may be used to store the layout design data and the density violation waiver information for the tool for waiving density violations 400 to retrieve.

Various approached may be applied to prepare waiver region identification items and waiver geometric items. The density check unit 410 may run a density check process for waiver region identification. After the density check process, a circuit designer may designate layout areas in a circuit design as waiver regions. Waiver geometric elements may then be generated and placed in cells associated with the waiver regions. The names of the cells can be used as waiver region identification items. The designer may also provide waiving threshold information that is associated with the waiver region identification items and the waiver geometric elements.

Additionally or alternatively, some embodiments of the invention allow a designer or a manufacturer to designate waiver regions and waiver geometric elements in a layout design without conducting a density check process. A designer or a manufacture may provide a reference pattern of layout geometries across one or more layers. The reference pattern represents layout regions where density violations may be waived. A pattern matching technique can be applied to search for layout patterns in a layout design that match the reference pattern. The identified layout patterns are the waiver regions associated with the reference pattern. Accordingly, the reference pattern may serve as the waiver region identification item and may be associated with one or more waiver geometric elements provided by the designer or the manufacturer. The reference pattern itself may serve as the waiver geometric element as well.

Besides reference patterns for pattern matching, cell names and markers may also serve as the waiver region identification items. A designer may designate density violations within a cell or a layout region identified by a layout marker (marker) as waived density violations. In this situation, the boundary of the cell or the layout region may be used to generate a waiver geometric element.

Figure 5:
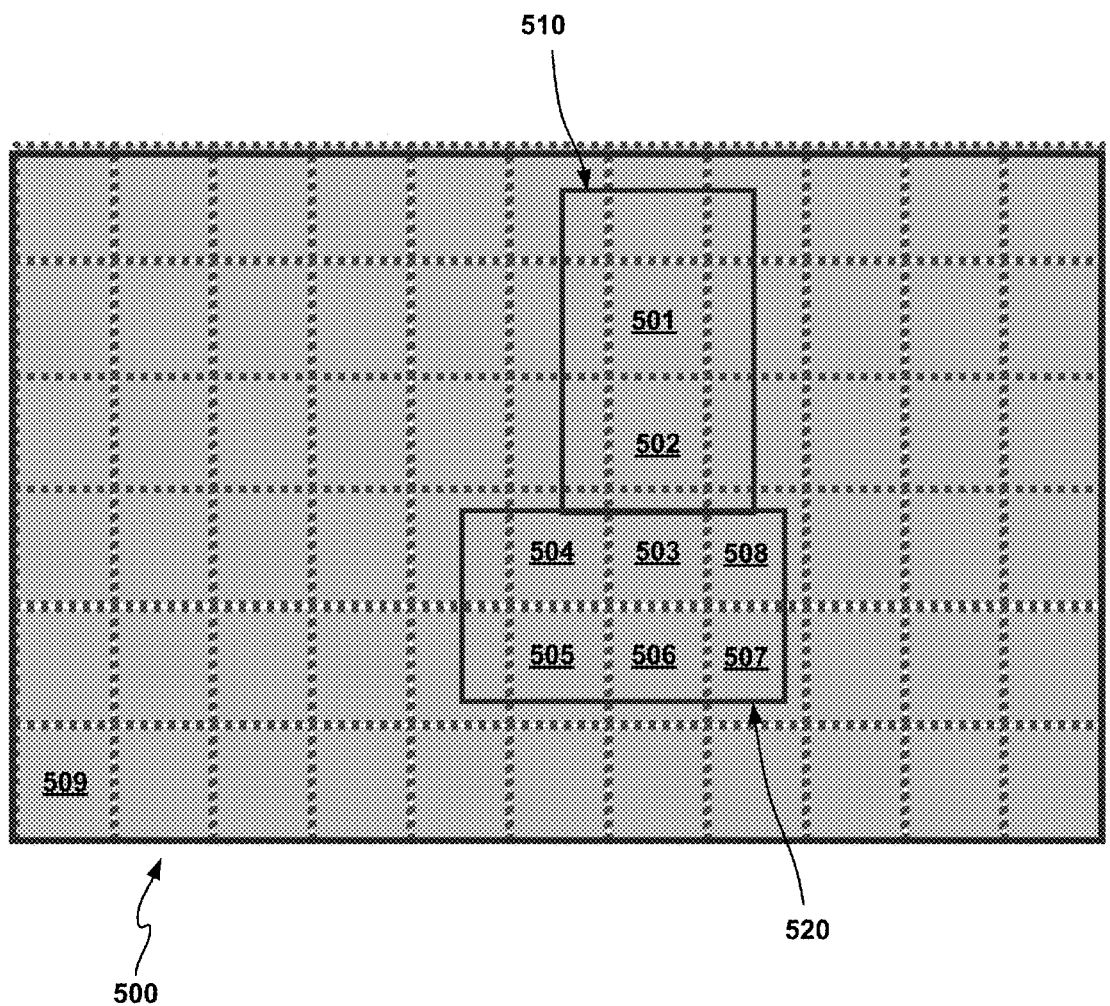
FIG. 5 illustrates a portion of a layout design layer being divided into multiple density check windows and two waiver geometric elements.

After the tool for waiving density violations 400 receives the layout design data and the density violation waiver information, the overlap information determination unit 420 determines overlap information for each of density check windows overlapping with the waiver geometric elements. In a density check process, a design layer is usually divided into multiple smaller areas or "density check windows." FIG. 5 illustrates a portion of a design layer 500 being divided into density check windows such as windows 501-509. While these density check windows have a rectangular shape, other shapes of density check windows (e.g., square shape) may be used. FIG. 5 also shows two waiver geometric elements 510 and 520. With various implementations of the invention, the overlap information determination unit 420 calculates percentages of window area for each density check window occupied by the two waiver geometric elements 510 and 520. For example, one hundred percent of windows 501-503 and over seventy-five percent of windows 504-508 are occupied while the rest of the density check windows have either no overlaps or an overlap percentage less than 75%.

Based on the overlap information and the waiver threshold information, the density and waiver check unit 440 performs a density and waiver check process on the layout design. In some embodiments of the invention, the density and waiver check unit 440 performs a density check process first to determine pattern density information for each of the density check windows. Commercial density check tools such as the CALIBRE® verification and manufacturability software tools available from Mentor Graphics® Corporation of Wilsonville, Oreg., may be implemented and applied by the density and waiver check unit 440. This density check process may be applied before, after or concurrently with the overlap determination process discussed above. Next, the density and waiver check unit 440 identifies density violations and waived density violations based on the pattern density information, the overlap information and the waiving threshold information. In the example of FIG. 5, assume each of the density check windows is found to have a pattern density value less than a required value and violates a density check rule. Because of the existence of the two waiver geometric elements 510 and 520, however, not every density check window will be reported as density violations. If the waiving threshold value is set at 100%, windows 501-503 will be designated as waived density violations while the rest of the density check windows will be designated as density violations. If the waiving threshold value is set at 75%, windows 501-508 will be designated as waived density violations while the rest of the density check windows will be designated as density violations. The density violations and the waived density violations may be stored separately in the output database 465 for subsequent processes such as filling density violation regions with "dummy" polygon structures.

In some other embodiments of the invention, the density and waiver check unit 440 first identifies not-for-waiving density check windows and waiver density check windows in the density check windows based on the overlap information and the waiving threshold information. The not-for-waiving density check windows may be density check windows of which overlaps with the waiver geometric elements are less than corresponding threshold values included in the waiving threshold information, while the waiver density windows may be those with overlaps above or equal to the corresponding threshold values. In the example of FIG. 5, if the waiving threshold value is set at 75%, windows 501-508 will be designated as waiver density check windows and the rest as not-for-waiving density check windows. Next, the overlap information determination unit 420 determines patent density values for the not-for-waiving density check windows and identifies density violations based on the pattern density values. No pattern density values are determined for the waiver density check windows in these embodiments of the invention. The density violations, as well as information about the waiver density check windows may be stored in the output database 465. Again, the overlap information determination unit 420 and the density and waiver check unit 440 may work concurrently on each of the density check windows.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of waiving density violations, comprising using a computing device to perform:
   receiving layout design data for a layout design and density violation waiver information, the density violation waiver information comprising waiver data that associate waiver region identification items with waiver geometric elements and with waiving threshold information;
   determining overlap information for each of density check windows overlapping with the waiver geometric elements, the overlap information indicating a degree to which one or more of the waiver geometric elements occupy a respective one of the density check windows; and
   performing a density and waiver check process on the layout design based on the overlap information and the waiver threshold information.

2. The method recited in claim 1, wherein the density and waiver check process comprises:
   determining pattern density information for each of the density check windows; and
   identifying one or more density violations and one or more waived density violations based on the pattern density information, the overlap information and the waiving threshold information, each of the one or more density violations and the one or more waived density violations corresponding to one of the density check windows.

3. The method recited in claim 2, wherein information for the one or more density violations and information for the one or more waived density violations are stored separately.

4. The method recited in claim 1, wherein the density and waiver check process comprises:
   identifying not-for-waiving density check windows and waiver density check windows in the density check windows based on the overlap information and the waiving threshold information;
   determining pattern density values for the not-for-waiving density check windows; and
   identifying one or more density violations in the not-for-waiving density check windows based on the pattern density values.

5. The method recited in claim 1, wherein the waiving threshold information comprising a minimum percentage value for a density check window being occupied by the waiver geometric elements, above which a density violation of the density check window should be waived.

6. The method recited in claim 1, wherein the waiver region identification items comprise information of reference patterns for pattern matching.

7. The method recited in claim 1, wherein the waiver region identification items comprise cell names.

8. The method recited in claim 1, wherein the waiver region identification items comprise information of markers.

9. The method recited in claim 1, wherein the waiver region identification items and the waiver geometric items are determined based on a density check process for waiver region identification.

10. The method recited in claim 1, wherein the waiver geometric elements comprise the waiver region identification items.

11. The method recited in claim 1, wherein the waiver region identification items comprise the waiver geometric elements.

12. A non-transitory processor-readable medium storing processor-executable instructions for causing one or more processors to perform a method of waiving density violations, the method comprising:
   receiving layout design data for a layout design and density violation waiver information, the density violation waiver information comprising waiver data that associate waiver region identification items with waiver geometric elements and with waiving threshold information;
   determining overlap information for each of density check windows overlapping with the waiver geometric elements, the overlap information indicating a degree to which one or more of the waiver geometric elements occupy a respective one of the density check windows; and
   performing a density and waiver check process on the layout design based on the overlap information and the waiver threshold information.

13. The non-transitory processor-readable medium recited in claim 12, wherein the density and waiver check process comprises:
   determining pattern density information for each of the density check windows; and
   identifying one or more density violations and one or more waived density violations based on the pattern density information, the overlap information and the waiving threshold information, each of the one or more density violations and the one or more waived density violations corresponding to one of the density check windows.

14. The non-transitory processor-readable medium recited in claim 12, wherein the density and waiver check process comprises:
   identifying not-for-waiving density check windows and waiver density check windows in the density check windows based on the overlap information and the waiving threshold information;
   determining pattern density values for the not-for-waiving density check windows; and
   identifying one or more density violations in the not-for-waiving density check windows based on the pattern density values.

15. The non-transitory processor-readable medium recited in claim 12, wherein the waiver region identification items comprise information of reference patterns for pattern matching.

16. The non-transitory processor-readable medium recited in claim 12, wherein the waiver region identification items comprise cell names.

17. The non-transitory processor-readable medium recited in claim 12, wherein the waiver region identification items comprise information of markers.

18. The non-transitory processor-readable medium recited in claim 12, wherein the waiver region identification items and the waiver geometric items are determined based on a density check process for waiver region identification.

19. A system comprising:
   one or more processors; and
   memory,
   the one or more processors being programmed to perform a method of waiving density violations, the method comprising:
      receiving layout design data for a layout design and density violation waiver information, the density violation waiver information comprising waiver data that associate waiver region identification items with waiver geometric elements and with waiving threshold information;

determining overlap information for each of density check windows overlapping with the waiver geometric elements, the overlap information indicating a degree to which one or more of the waiver geometric elements occupy a respective one of the density check windows; and performing a density and waiver check process on the layout design based on the overlap information and the waiver threshold information.

* * * * *